(12) United States Patent
Pellela et al.

(10) Patent No.: US 7,718,503 B2
(45) Date of Patent: May 18, 2010

(54) SOI DEVICE AND METHOD FOR ITS FABRICATION

(75) Inventors: Mario M. Pellela, Mountain View, CA (US); Donggang D. Wu, Austin, TX (US); James F. Buller, Austin, TX (US)

(73) Assignee: GlobalFoundries Inc., Grand Caymens (KY)

( * ) Notice: Subject to any disclaimer, the term of this patent is extended or adjusted under 35 U.S.C. 154(b) by 580 days.

(21) Appl. No.: 11/459,316

(22) Filed: Jul. 21, 2006

(65) Prior Publication Data

US 2008/0017906 A1   Jan. 24, 2008

(51) Int. Cl.
*H01L 21/20* (2006.01)
(52) U.S. Cl. .............. 438/396; 257/E21.351; 257/E21.364
(58) Field of Classification Search .......... 438/200, 438/237, 253, 396; 257/306, 347, 373, E21.351, 257/E21.364
See application file for complete search history.

(56) References Cited

U.S. PATENT DOCUMENTS

| | | | |
|---|---|---|---|
| 6,303,414 B1 | 10/2001 | Ang et al. | |
| 6,452,234 B1 | 9/2002 | Mahanpour | |
| 6,844,223 B2 * | 1/2005 | Ko et al. | 438/152 |
| 7,154,151 B2 * | 12/2006 | Minami | 257/355 |
| 7,205,190 B2 * | 4/2007 | Okihara | 438/233 |
| 2002/0094629 A1 | 7/2002 | Belleville et al. | |
| 2005/0269642 A1 | 12/2005 | Minami | |
| 2006/0237726 A1 * | 10/2006 | Iwamatsu et al. | 257/72 |

FOREIGN PATENT DOCUMENTS

FR        2847715        5/2004

OTHER PUBLICATIONS

International Search Report for International Application No. PCT/US2007/016453, mailed Nov. 30, 2007.

* cited by examiner

*Primary Examiner*—Khiem D Nguyen
(74) *Attorney, Agent, or Firm*—Ingrassia Fisher & Lorenz, P.C.

(57) ABSTRACT

A silicon on insulator (SOI) device and methods for fabricating such a device are provided. The device includes an MOS capacitor coupled between voltage busses and formed in a monocrystalline semiconductor layer overlying an insulator layer and a semiconductor substrate. The device includes at least one electrical discharge path for discharging potentially harmful charge build up on the MOS capacitor. The MOS capacitor has a conductive electrode material forming a first plate of the MOS capacitor and an impurity doped region in the monocrystalline silicon layer beneath the conductive electrode material forming a second plate. A first voltage bus is coupled to the first plate of the capacitor and to an electrical discharge path through a diode formed in the semiconductor substrate and a second voltage bus is coupled to the second plate of the capacitor.

15 Claims, 11 Drawing Sheets

SOI DEVICE AND METHOD FOR ITS FABRICATION

TECHNICAL FIELD

The present invention generally relates to a semiconductor on insulator (SOI) device and to methods for fabricating such a device, and more particularly to SOI devices and to methods for fabricating SOI devices including a discharge path for a decoupling capacitor.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel FETs (PMOS transistors or PFETs) and N-channel FETs (NMOS transistors or NFETs) and the IC is then referred to as a complementary MOS or CMOS circuit. Certain improvements in performance of MOS ICs can be realized by forming the MOS transistors in a thin layer of semiconductor material overlying an insulator layer. Such semiconductor on insulator (SOI) MOS transistors, for example, exhibit lower junction capacitance and hence can operate at higher speeds.

The MOS transistors formed in and on the SOI layer are interconnected to implement the desired circuit function. A number of voltage busses are also connected to appropriate devices to power those devices as required by the circuit function. The voltage busses may include, for example, a $V_{dd}$ bus, a $V_{cc}$ bus, a $V_{ss}$ bus, and the like, and may include busses coupled to external power sources as well as busses coupled to internally generated or internally altered power sources. As used herein, the terms "$V_{dd}$ bus" and "$V_{cc}$ bus" as well as "voltage bus" and the like will apply to external as well as internal busses. As various nodes in the circuit are either charged or discharged during the operation of the circuit, the various busses must source or sink current to those nodes. Especially as the switching speed of the integrated circuits increases, the requirement of sourcing or sinking current by a bus can cause significant voltage spikes on the bus because of the inherent inductance of the bus. It has become commonplace to place decoupling capacitors between the busses to avoid logic errors that might be caused by the voltage spikes. For example, such decoupling capacitors can be connected between the $V_{dd}$ and $V_{ss}$ busses. These decoupling capacitors are typically distributed along the length of the busses. The capacitors are usually but not necessarily formed as MOS capacitors with one plate of the capacitor formed by the same material used to form the gate electrode of the MOS transistors, the other plate of the capacitor formed by an impurity doped region in the SOI layer, and the dielectric separating the two plates of the capacitor formed by the gate dielectric.

One problem that can affect the yield and reliability of the integrated circuit can occur when using such MOS capacitors as the decoupling capacitors between voltage busses. The problem occurs because sufficient charge can build up on a capacitor during fabrication of the IC to cause a destructive discharge through the capacitor dielectric material. This problem becomes more severe as device sizes shrink and especially as the thickness of the gate dielectric layer is reduced. The charge build up results from one or more of the plasma deposition and/or etching steps that are used to deposit and/or etch the interlayer dielectric materials and the metals or other conductors used in the final steps in fabricating the integrated circuits.

Accordingly, it is desirable to provide an MOS device and methods for fabricating such MOS devices that avoids the destructive effects of charge build up on decoupling capacitors. In addition, it is desirable to provide methods for fabricating an SOI device that incorporates decoupling capacitors and a discharge path for protecting the decoupling capacitors. Furthermore, other desirable features and characteristics of the present invention will become apparent from the subsequent detailed description and the appended claims, taken in conjunction with the accompanying drawings and the foregoing technical field and background.

BRIEF SUMMARY

A silicon on insulator (SOI) device that includes an MOS capacitor coupled between voltage busses and formed in a monocrystalline semiconductor layer overlying an insulator layer and a semiconductor substrate is provided. The device includes at least one electrical discharge path for discharging potentially harmful charge build up on the MOS capacitor. The MOS capacitor has a conductive electrode material forming a first plate of the MOS capacitor and an impurity doped region in the monocrystalline silicon layer beneath the conductive electrode material forming a second plate. A first voltage bus is coupled to the first plate of the capacitor and to an electrical discharge path through a diode formed in the semiconductor substrate. A second voltage bus is coupled to the second plate of the capacitor.

A method is provided for fabricating a silicon on insulator (SOI) device that includes a silicon substrate, a buried insulator layer overlying the silicon substrate, and a monocrystalline silicon layer overlying the buried insulator layer. The method comprises, in accordance with one embodiment of the invention, forming a dielectric isolation region extending through the monocrystalline semiconductor layer to the buried insulator layer. An opening is etched to extend through the dielectric isolation region and the buried insulator layer to expose a portion of the semiconductor substrate. The exposed portion of the semiconductor substrate is doped with impurities to form a PN junction diode in the semiconductor substrate. A portion of the monocrystalline semiconductor layer is doped with impurity dopants to form a first plate of a capacitor and an insulator layer is formed overlying the portion of the monocrystalline semiconductor layer. A conductive electrode is formed overlying the insulator layer to form a second plate of the capacitor. A first bus is coupled to the second plate of the capacitor and to the diode and a second bus is coupled to the first plate of the capacitor.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
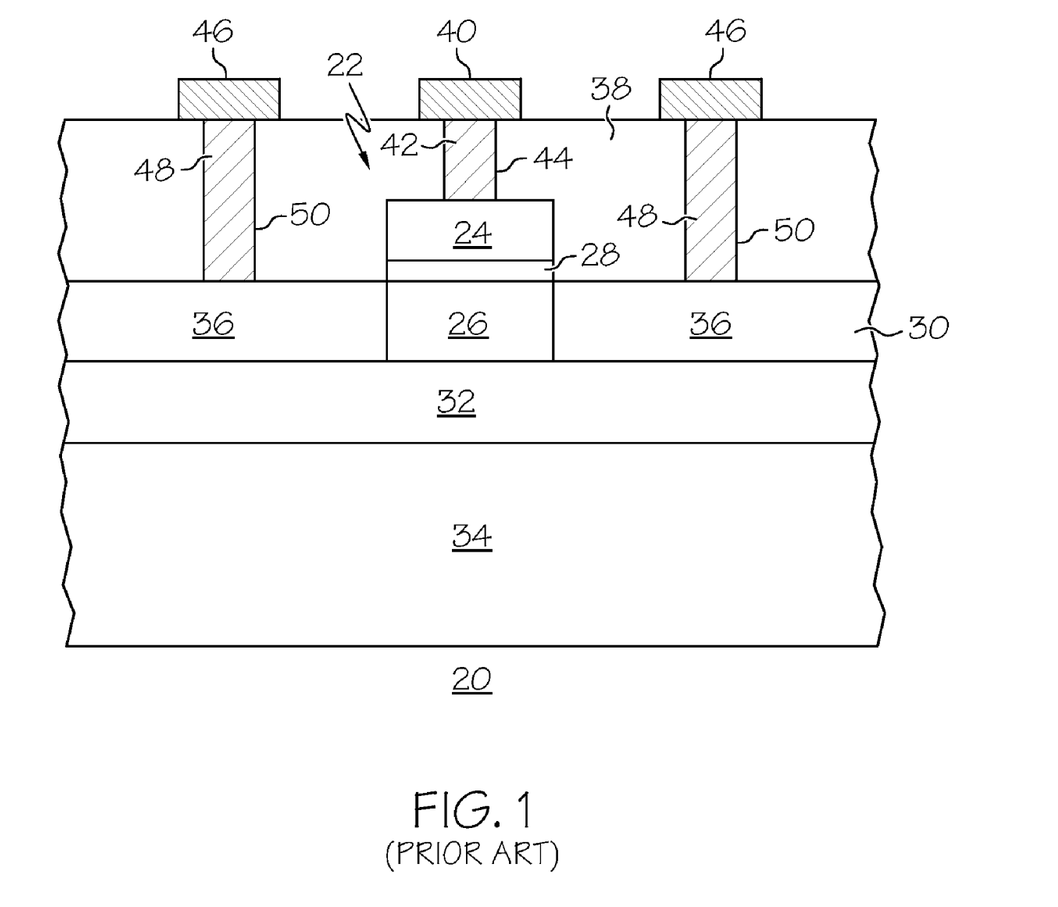
FIG. 1 illustrates, in partial cross section, a portion of a prior art decoupling capacitor.

FIG. 1 illustrates, in partial cross section, elements of a conventional decoupling capacitor structure 20 implemented in a portion of a silicon on insulator (SOI) integrated circuit (IC) device structure. Such an IC structure might include a plurality of distributed MOS capacitors 22 (only one of which is illustrated), each of which includes a top plate 24, a bottom plate 26 and a capacitor dielectric 28. Top plate 24 generally is formed from the same material as are the gate electrodes of the MOS transistor that make up the remainder of the IC. Capacitor dielectric 28 generally is formed of the same material used for the gate dielectric of the MOS transistors of the IC. Bottom plate 26 is formed of a thin layer 30 of silicon that overlies insulator 32 that, in turn overlies semiconductor substrate 34. In this exemplary illustration layer 30 of silicon is doped N-type. Heavily doped N+ contacts 36, formed in self alignment with top plates 24, facilitate ohmic contact to layer 30. An interlayer dielectric 38 overlies the capacitor structures and electrically isolates the capacitors from other layers of metallization that may be used to interconnect devices of the IC. A bus such as a $V_{dd}$ bus 40 is coupled to top plates 24 by metallized contacts 42 formed in openings 44 through interlayer dielectric 38. A bus such as a $V_{ss}$ bus 46 is coupled to bottom plate 26 by metallized contacts 48 formed in openings 50 through interlayer dielectric 38 and contacting N+ contacts 36. For each of the busses a plurality of metallized contacts is generally used to insure good contact between the bus and the respective plate of the capacitor. Also, a plurality of capacitor structures is coupled between the two busses, and such capacitor structures will be found distributed about the integrated circuit.

FIGS. 2-11 illustrate, in cross section, method steps for forming a portion of a decoupling capacitor 52 as part of a silicon on insulator CMOS integrated circuit 53 in accordance with an embodiment of the invention. In accordance with an embodiment of the invention, explained more fully below, decoupling capacitor 52 includes at least one discharge path by which charge that builds up on the capacitor or on any non-ground node in the circuit during processing can be safely discharged to avoid destruction of the capacitor dielectric. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. In these illustrative embodiments only a small portion of CMOS integrated circuit 53 is illustrated, specifically the portion of the circuit in which decoupling capacitor 52 is formed in addition to one N-channel MOS transistor (NMOS transistor) and one P-channel MOS transistor (PMOS transistor). Various steps in the manufacture of CMOS devices are well known and so, in the interest of brevity, many conventional steps will only be mentioned briefly herein or will be omitted entirely without providing the well known process details. Although in this illustrative embodiment the integrated circuit is described as a CMOS circuit, the invention is also applicable to the fabrication of a single channel type MOS circuit. This application is related to co-pending application Ser. No. 11/133,969, the disclosure of which is incorporated by reference in its entirety.

Figure 2:
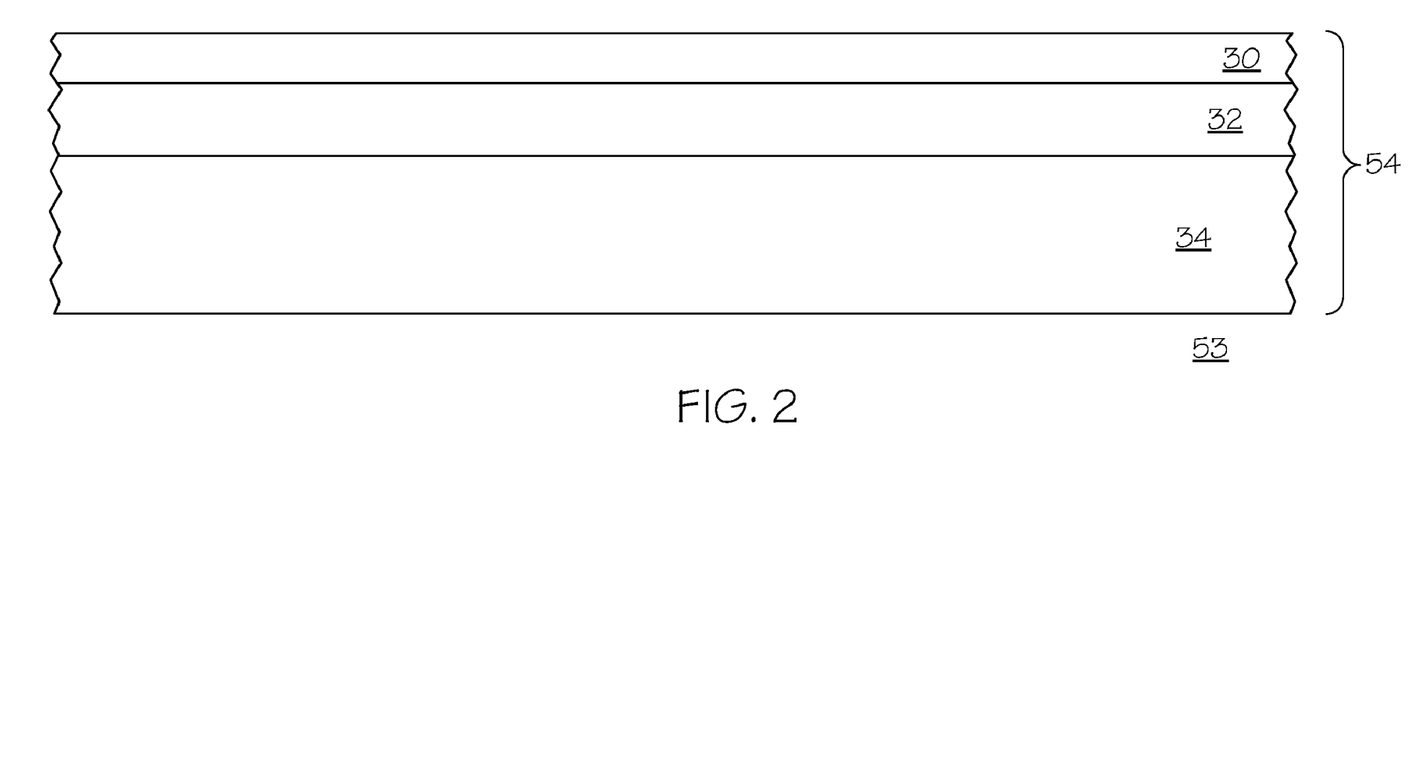
FIG. 2-11 illustrate, in cross section, method steps for fabricating an SOI integrated circuit in accordance with various embodiments of the invention.

As illustrated in FIG. 2, the method in accordance with one embodiment of the invention begins by providing a semiconductor substrate 54. The semiconductor substrate is preferably a silicon substrate with a monocrystalline silicon layer 30 formed overlying a monocrystalline silicon carrier substrate 34. As used herein, the terms "silicon layer" and "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. For ease of description, but without limitation, the semiconductor materials will generally be referred to herein as silicon materials. Monocrystalline silicon layer 30 will be used in the formation of N-channel and P-channel MOS transistors as well as decoupling capacitor 52. Monocrystalline silicon substrate 34 provides a support for monocrystalline silicon layer 30 and, in accordance with an embodiment of the invention, will be used for the formation of discharge paths for discharging potentially deleterious charge build up on decoupling capacitor 52. Monocrystalline silicon layer 30 is bonded to monocrystalline silicon carrier substrate 34 by well known wafer bonding and thinning techniques with a dielectric insulating layer 32 separating monocrystalline silicon layer 30 from monocrystalline carrier substrate 34. The monocrystalline silicon layer is thinned to a thickness of about 50-300 nanometers (nm) depending on the circuit function being implemented. Both the monocrystalline silicon layer and the monocrystalline silicon carrier substrate preferably have a resistivity of at least about 1-35 Ohms per square. In accordance with one embodiment of the invention thin silicon layer 30 is impurity doped N-type and monocrystalline carrier substrate 34 is impurity doped P-type. Dielectric insulating layer 32, typically silicon dioxide, preferably has a thickness of about 50-200 nm.

As one alternative to the wafer bonding technique, monocrystalline semiconductor substrate 54 can be formed by the SIMOX process. The SIMOX process is a well known process in which oxygen ions are implanted into a sub-surface region of monocrystalline silicon substrate 34. The monocrystalline silicon substrate and the implanted oxygen are subsequently heated to form a sub-surface silicon oxide dielectric layer 32 that electrically isolates the upper portion of the substrate, SOI layer 30, from the remaining portion of monocrystalline silicon substrate 34. The thickness of SOI layer 30 is determined by the energy of the implanted ions. Regardless of the method used to form the SOI layer, dielectric layer 32 is commonly referred to as a buried oxide or "BOX" and will so be referred to herein.

Figure 3:
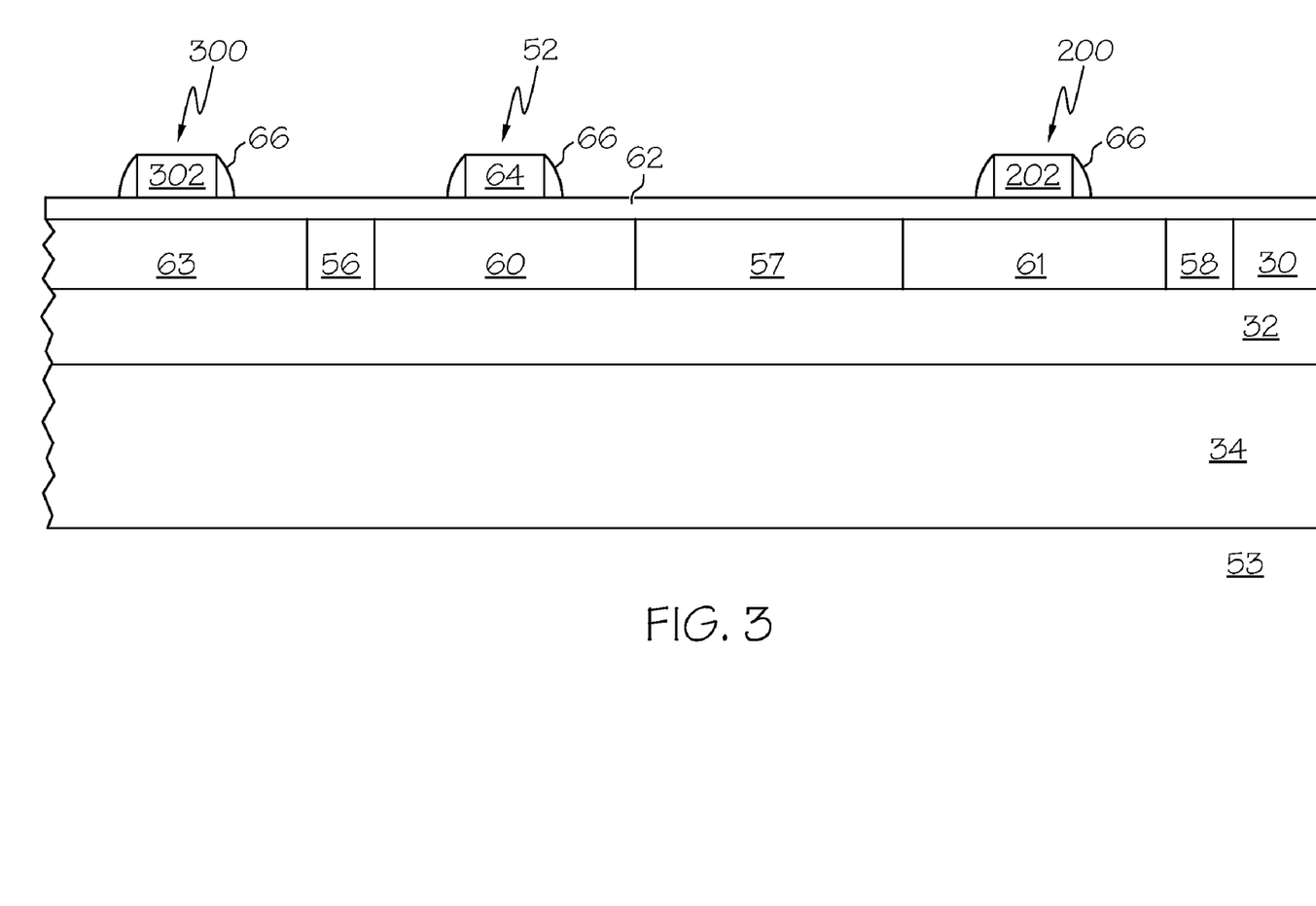

Having provided a semiconductor substrate 54, the method in accordance with one embodiment of the invention continues as illustrated in FIG. 3 by the formation of dielectric isolation regions 56-58 extending through monocrystalline silicon layer 30 to dielectric layer or BOX 32. The dielectric isolation regions are preferably formed by the well known shallow trench isolation (STI) technique in which trenches are etched into monocrystalline silicon layer 30, the trenches are filled with a dielectric material such as deposited silicon dioxide, and the excess silicon dioxide is removed by CMP. As is well known, there are many processes that can be used to form the STI, so the process need not be described here in detail. In this illustrative example only a single N-channel MOS transistor 300, a single P-channel MOS transistor 200, and a single decoupling capacitor 52 will be illustrated. Those of skill in the art will appreciate that many other devices may be needed to implement a desired circuit function including a plurality of N-channel MOS transistors, a plurality of P-channel MOS transistors, and a plurality of decoupling capacitors. Accordingly, additional STI regions (not illustrated) can be formed to provide electrical isolation, as needed, between the various other devices of the CMOS circuit that is to be formed in and on monocrystalline silicon layer 30.

In accordance with an embodiment of the invention, the portion 60 of thin monocrystalline silicon layer 30 between dielectric isolation regions 56 and 57 can be doped N-type. The N-type doing can be the original doping of layer 30, or can be subsequent doping by ion implantation or the like. Portion 60 of the thin monocrystalline silicon layer 30 forms the bottom plate of decoupling capacitor 52. In like manner, portion 61 of thin monocrystalline silicon layer 30 between dielectric isolation regions 57 and 58 can also be doped N-type. Portion 61 will be used for the formation of a P-channel transistor 200. Portion 63 of layer 30 adjacent dielectric isolation region 56 can be doped P-type, for example by ion implantation. Portion 63 will be used for the formation of an N-channel transistor 300. Portions of layer 30 that are not to receive a particular implantation can be masked by a patterned layer of photoresist in accordance with well known photolithography and ion implantation techniques. As illustrated in FIG. 3, a layer of dielectric material 62 is formed at least on the surface of portion 60, portion 61, and portion 63 of the SOI layer. Dielectric material 62 preferably has a thickness of about 1-3 nm and most preferably has a thickness of about 1.5-2.0 nm. Dielectric material 62 forms the gate insulator of P-channel transistor 200, N-channel transistor 300, and the capacitor dielectric of capacitor 52. It is not necessary that layer 62 be used for all three devices; that is, one dielectric layer could be used for the capacitor dielectric and a different dielectric layer could be used for the gate insulator of transistors 200 and/or 300, but using layer 62 for all three devices helps to minimize the number of method steps. The dielectric material can be thermally grown silicon dioxide formed by heating silicon layer 30 in an oxidizing ambient or can be a deposited layer of silicon oxide, silicon oxynitride, silicon nitride, or a high dielectric constant dielectric such as HfSiO, or the like. Deposited insulators can be deposited by chemical vapor deposition (CVD), low pressure chemical vapor deposition (LPCVD), or plasma enhanced chemical vapor deposition (PECVD). As illustrated, layer 62 is a deposited layer that deposits on the dielectric isolation regions as well as on the thin silicon layer 30. A layer of polycrystalline silicon or other gate electrode forming material is deposited onto the layer of dielectric material and is patterned to form a top plate 64 of decoupling capacitor 52, a gate electrode 202 of P-channel MOS transistor 200, and a gate electrode 302 of N-channel MOS transistor 300. The gate electrode forming material will hereinafter be referred to, for convenience of description but without limitation, as polycrystalline silicon although those of skill in the art will recognize that other materials can also be used. The polycrystalline silicon can be deposited by CVD or LPCVD by the reduction of silane ($SiH_4$). A layer of hard mask material such as silicon oxide, silicon nitride, silicon oxynitride, or the like (not illustrated) can also be deposited over the layer of polycrystalline silicon to aid in the patterning and etching of the gate electrodes. The polycrystalline silicon layer can be patterned using a patterned photoresist layer and conventional photolithography techniques and plasma etching in a Cl or $HBr/O_2$ chemistry. In a preferred embodiment of the invention, sidewall spacers 66 are formed on the edges of top plate 64, gate electrode 202, and gate electrode 302. The sidewall spacers can be formed by anisotropically etching a layer of silicon oxide, silicon nitride, or the like in well known manner. The layer of spacer forming material is anisotropically etched, for example by reactive ion etching (RIE) using a $CHF_3$, $CF_4$, or $SF_6$ chemistry to remove the layer from substantially horizontal surfaces (the tops of the polycrystalline silicon features) and to leave the layer on substantially vertical surfaces (the sidewalls of the polycrystalline silicon features).

Figure 4:
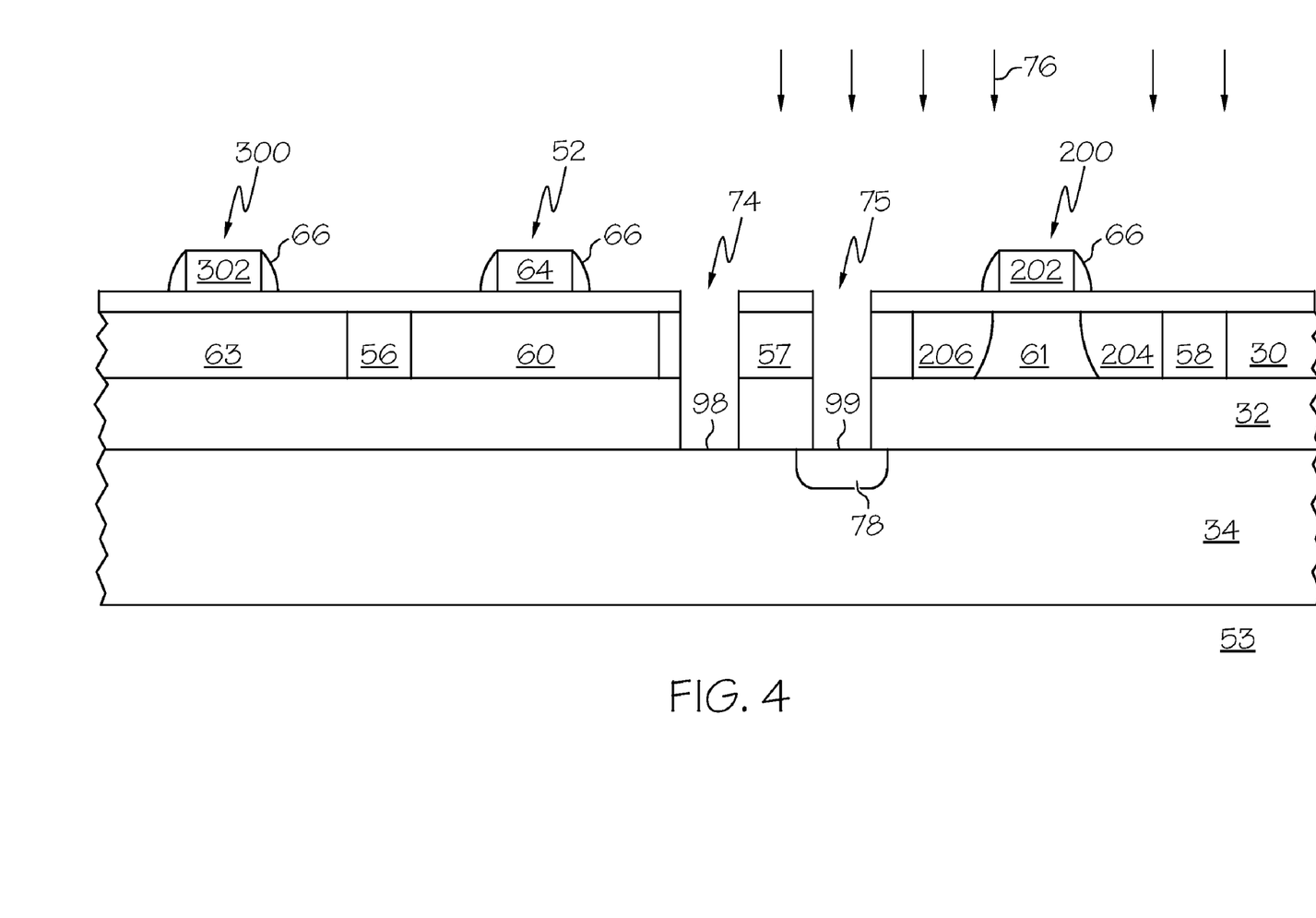

As illustrated in FIG. 4, at least one opening 74 is etched through a portion of dielectric isolation region 57 and the underlying dielectric layer 32. In accordance with a preferred embodiment of the invention a second opening 75 is also etched through the dielectric isolation region and the underlying dielectric layer. Although both opening 74 and opening 75 are shown to be etched through the same dielectric isolation region, the two openings can be etched through separate isolation regions. Openings 74 and 75 are anisotropically etched, preferably by reactive ion etching. The dielectric layers can be reactive ion etched, for example, using a $CF_4$, $CHF_3$, or $SF_6$ chemistry. Opening 74 exposes a portion 98 of the surface of monocrystalline silicon carrier substrate 34 and opening 75 exposes a portion 99 of the carrier substrate. The etching can be masked, for example, by a patterned layer of photoresist (not illustrated).

As also illustrated in FIG. 4, boron ions or other P-type conductivity determining ions are implanted through opening 75, as indicated by arrows 76, into monocrystalline silicon carrier substrate 34 to form a contact region 78 in the carrier substrate. The same P-type ion implantation can also be directed into thin monocrystalline silicon layer 30 to form source 204 and drain 206 regions of P-channel MOS transistor 200 of integrated circuit 53. The ion implantation of the source and drain regions is masked by and thus self aligned to gate electrode 202 and the associated sidewall spacers 66. Other devices can be masked during the P-type ion implantation by a patterned layer of photoresist (not illustrated).

Figure 5:
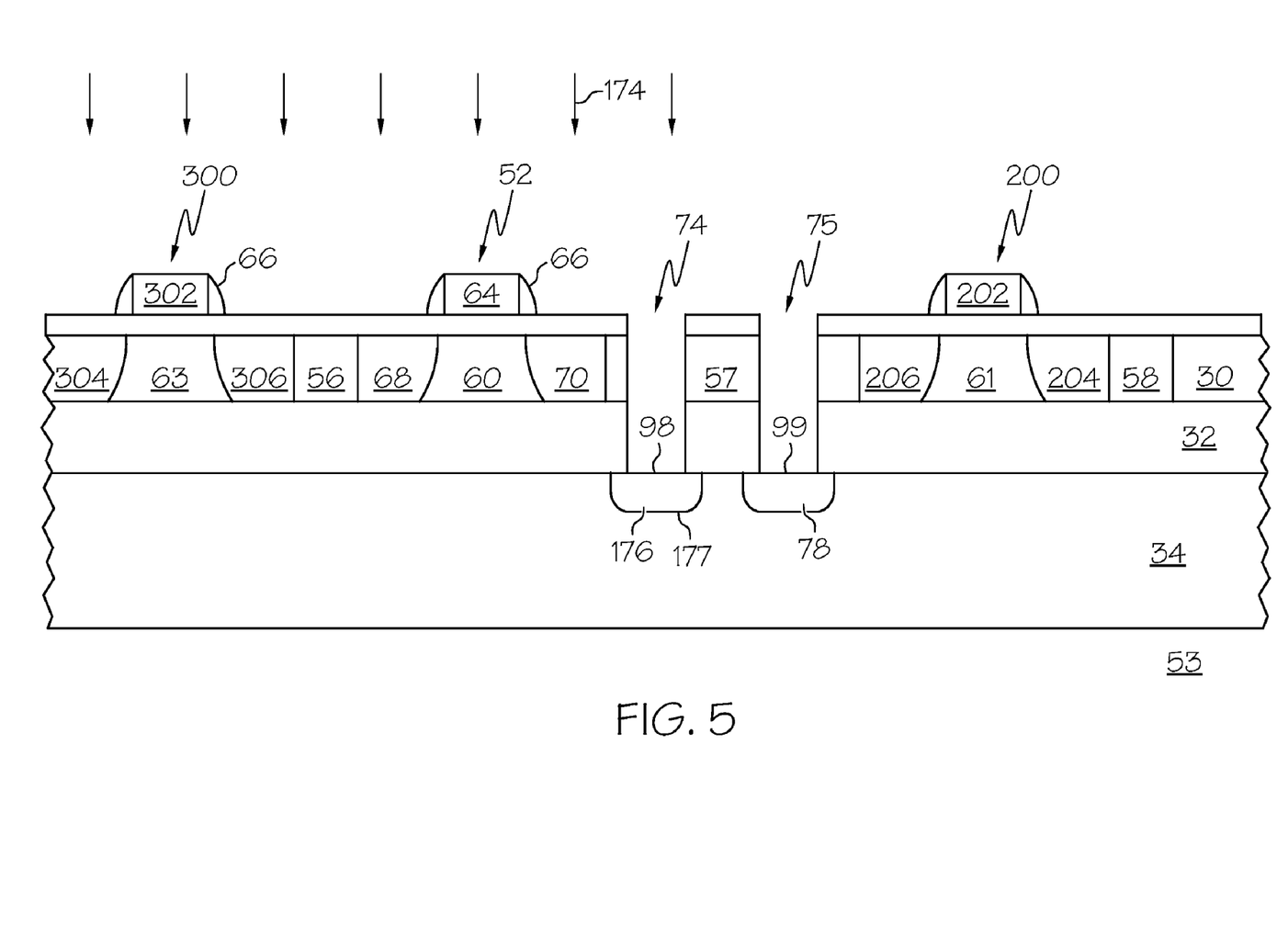

Either before or after the implantation of P-type conductivity determining ions through opening 75, N-type conductivity determining ions such as arsenic or phosphorus are implanted through opening 74 as indicated by arrows 174 as illustrated in FIG. 5. The N-type conductivity determining ions are implanted into monocrystalline silicon carrier substrate 34 to form an N-type region 176 that forms a PN junction diode 177 with the carrier substrate. The same N-type ion implantation can be used to form contact regions 68, 70 in self alignment with top plate 64 by implanting the ions into portion 60 of thin monocrystalline silicon layer 30 using top plate 64 and sidewall spacers 66 as ion implantation masks. The heavily doped (N+) contact regions facilitate good electrical contact to the bottom plate of the decoupling capacitor. At the same time that diode region 176 and contact regions 68, 70 are being ion implanted, the same implantation can be used to implant the drain 304 and source 306 regions of N-channel MOS transistor 300. The ion implantation of the source and drain regions is masked by and thus self aligned to gate electrode 302 and the associated sidewall spacers 66. During the N-type ion implantation, P-channel MOS transistor 200 and other regions of the integrated circuit can be masked in known manner, for example with a layer of photoresist (not illustrated).

Figure 6:
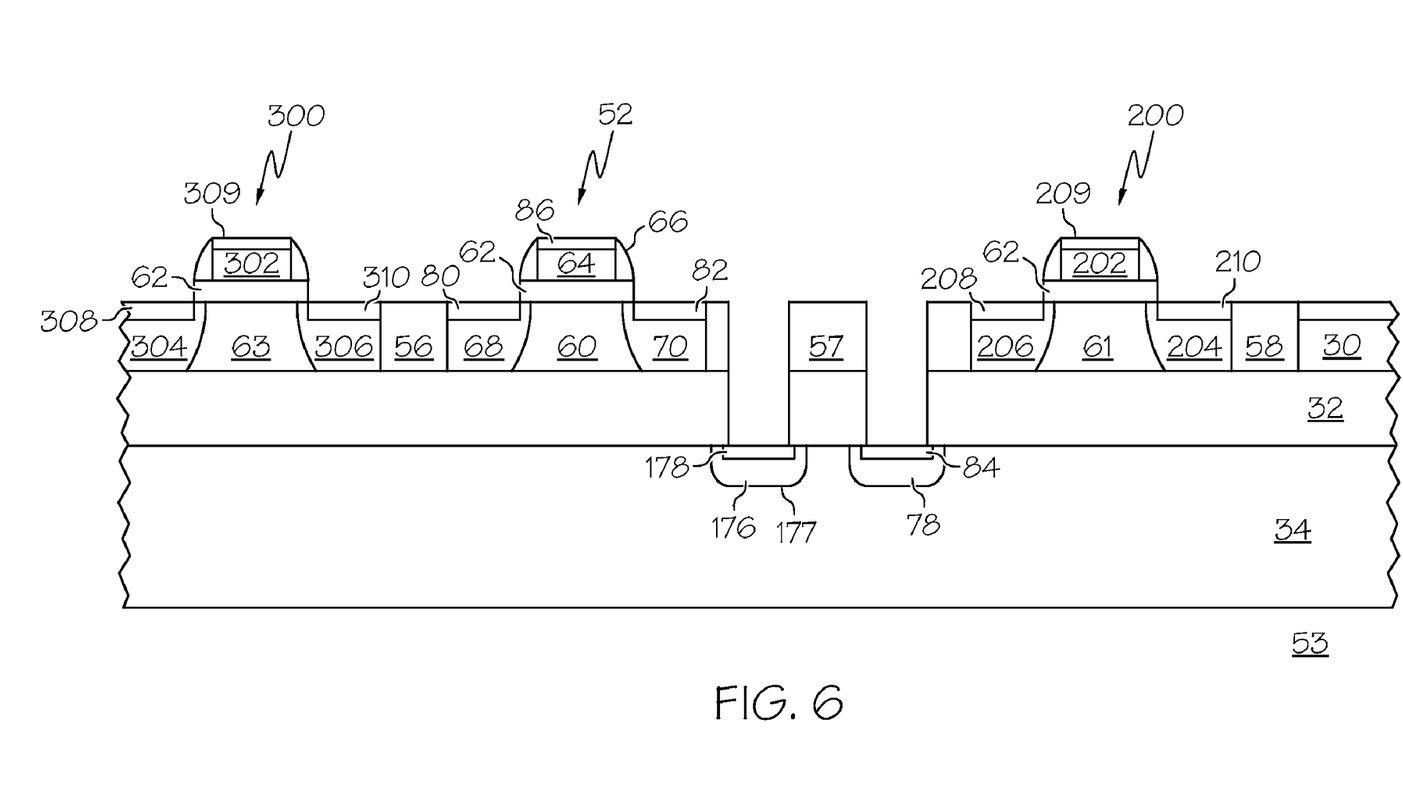

After removing the masking photoresist layer, the exposed portions of insulator layer 62 are removed and, in accordance with one embodiment of the invention, a layer of silicide forming metal such as nickel, cobalt, titanium, palladium, or the like is globally deposited onto the structure. The silicide forming metal is deposited in contact with the ion implanted contact region 78, diode region 176, regions 68, 70 and polycrystalline silicon top plate 64 of capacitor structure 52, source 204 and drain 206 regions and gate electrode 202 of PMOS transistor 200, as well as in contact with drain 304 and source 306 regions and gate electrode 302 of NMOS transistor 300. The silicide forming metal preferably has a thickness of about 5-15 nm. The silicide forming metal is heated, preferably to a temperature of about 350°-500° C. to cause the metal to react with the silicon with which it is in contact to form metal silicide contact regions 80 and 82 on contact region 68, 70, respectively, a metal silicide contact 84 on contact region 78, a metal silicide contact 178 on diode region 176, a metal silicide contact 86 on polycrystalline silicon top plate 64, and metal silicide contacts 208 and 210 on MOS transistor 200 and 308 and 310 on MOS transistor 300, all as illustrated in FIG. 6. The metal that is not in contact with silicon, for example the metal that is deposited on the dielectric isolation regions, does not react during the heating step and is removed, for example by wet etching in a $H_2O_2/H_2SO_4$ or $HNO_3/HCl$ solution. Metal silicide contacts 209 and 309 to the gate electrodes of MOS transistors 200 and 300 may also be formed at the same time.

Figure 7:
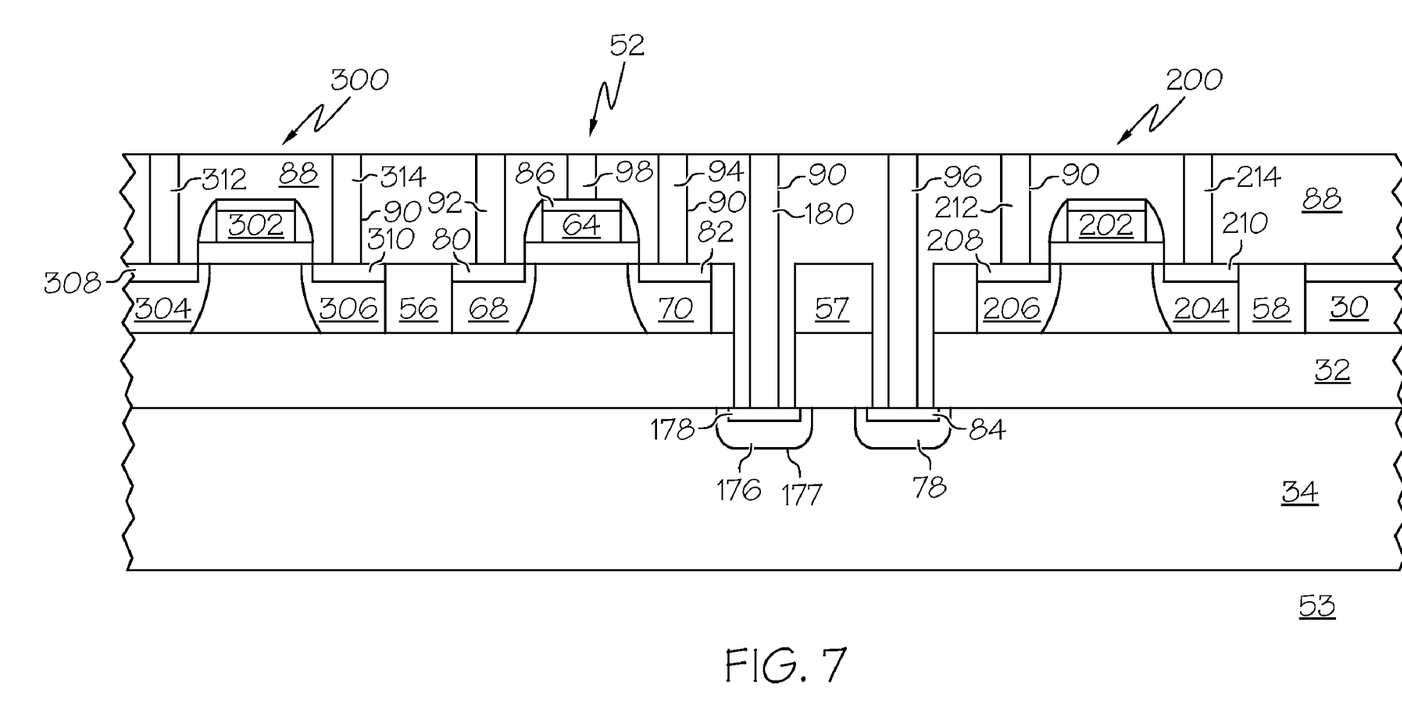

In accordance with an embodiment of the invention an interlayer dielectric material layer 88 such as silicon oxide is globally deposited to cover the polycrystalline silicon features and silicided regions and to fill openings 74 and 75. Layer 88 is subsequently photolithographically patterned and etched to form openings 90 that expose portions of metal silicide contacts 80, 82, 84, 178, 86, 208, 210, 308, and 310 as illustrated in FIG. 7. Interlayer dielectric material layer 88 can be deposited, for example, by CVD by the decomposition of a source material such as tetraethylorthosilicate (TEOS) and can be etched, for example, by reactive ion etching using a $CHF_3$, $CF_4$, or $SF_6$ chemistry. Conductive plugs are formed in openings 90. Conductive plug 92 contacts metal silicide contact 80, conductive plug 94 contacts metal silicide contact 82, conductive plug 96 contacts metal silicide contact 84, contact plug 180 contacts metal silicide contact 178, and conductive plug 98 contacts metal silicide contact 86 of capacitor structure 52. In like manner, conductive plugs 212, 214, 312, and 314 contact metal silicide contacts, 208, 210, 308, and 310, respectively. The conductive plugs can be formed in conventional manner, for example by depositing a layer of titanium, forming a layer of titanium nitride, and then depositing a layer of tungsten. The excess plug material can be removed from the surface of interlayer dielectric material 88 by a CMP process.

As illustrated in FIGS. 8-11, the decoupling capacitor structure is completed, in accordance with an embodiment of the invention, by depositing and patterning one or more layers of metal to form a $V_{dd}$ bus 100 and a $V_{ss}$ bus 102. Routing of the required busses and other interconnect metallization generally requires several layers of metallization. Those layers of metallization can be electrically separated by layers of dielectric material. The layer of metal can be aluminum, copper, an alloy of aluminum or copper, or the like. Those of skill in the art will understand that aluminum metallization is generally deposited and then photolithographically patterned and etched whereas copper metallization is generally patterned by a damascene process. FIGS. 8-11 schematically illustrate steps for the formation of $V_{dd}$ bus 100 and $V_{ss}$ bus 102 from a metal such as aluminum.

Figure 8:
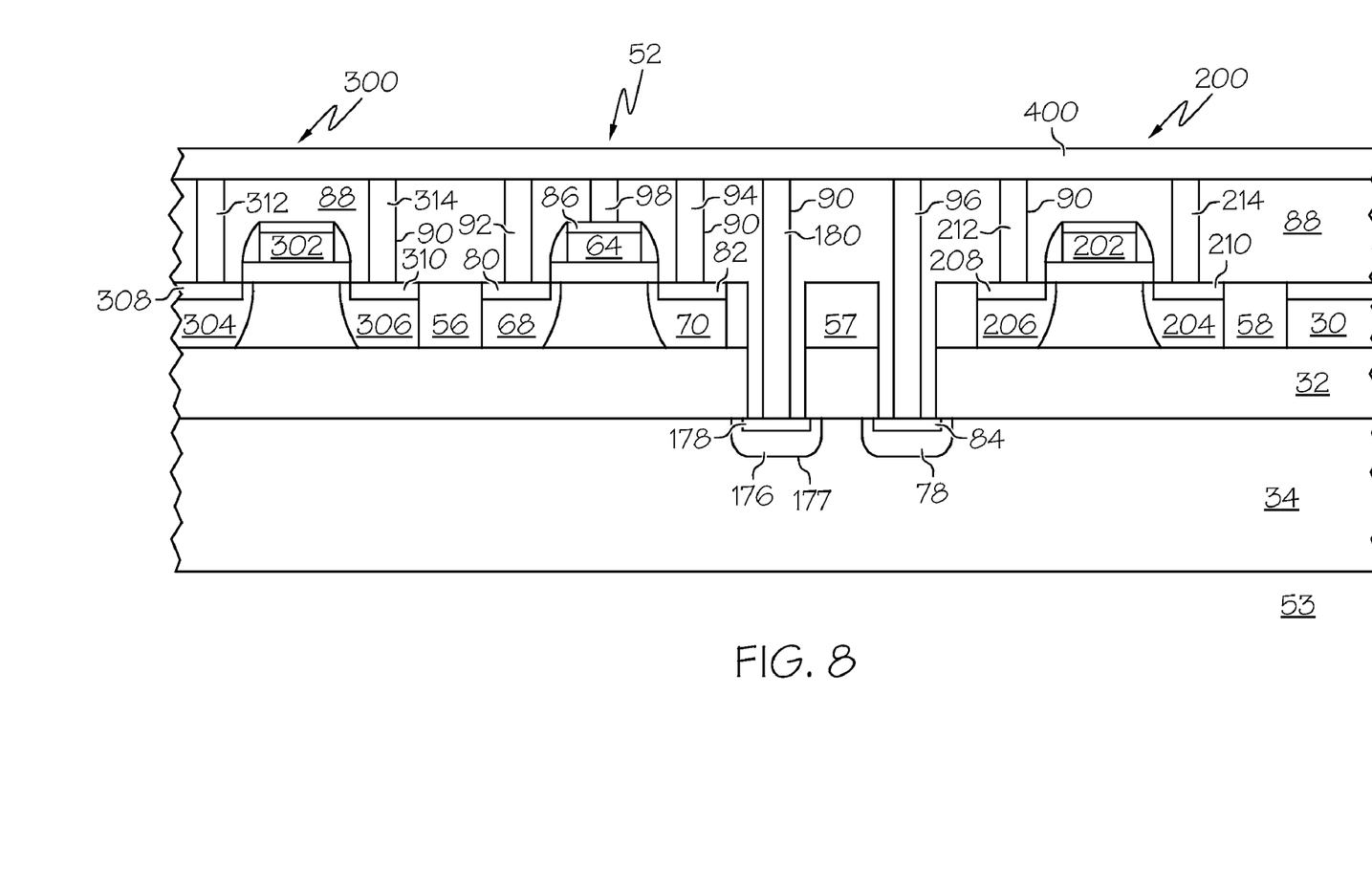
Figure 9:
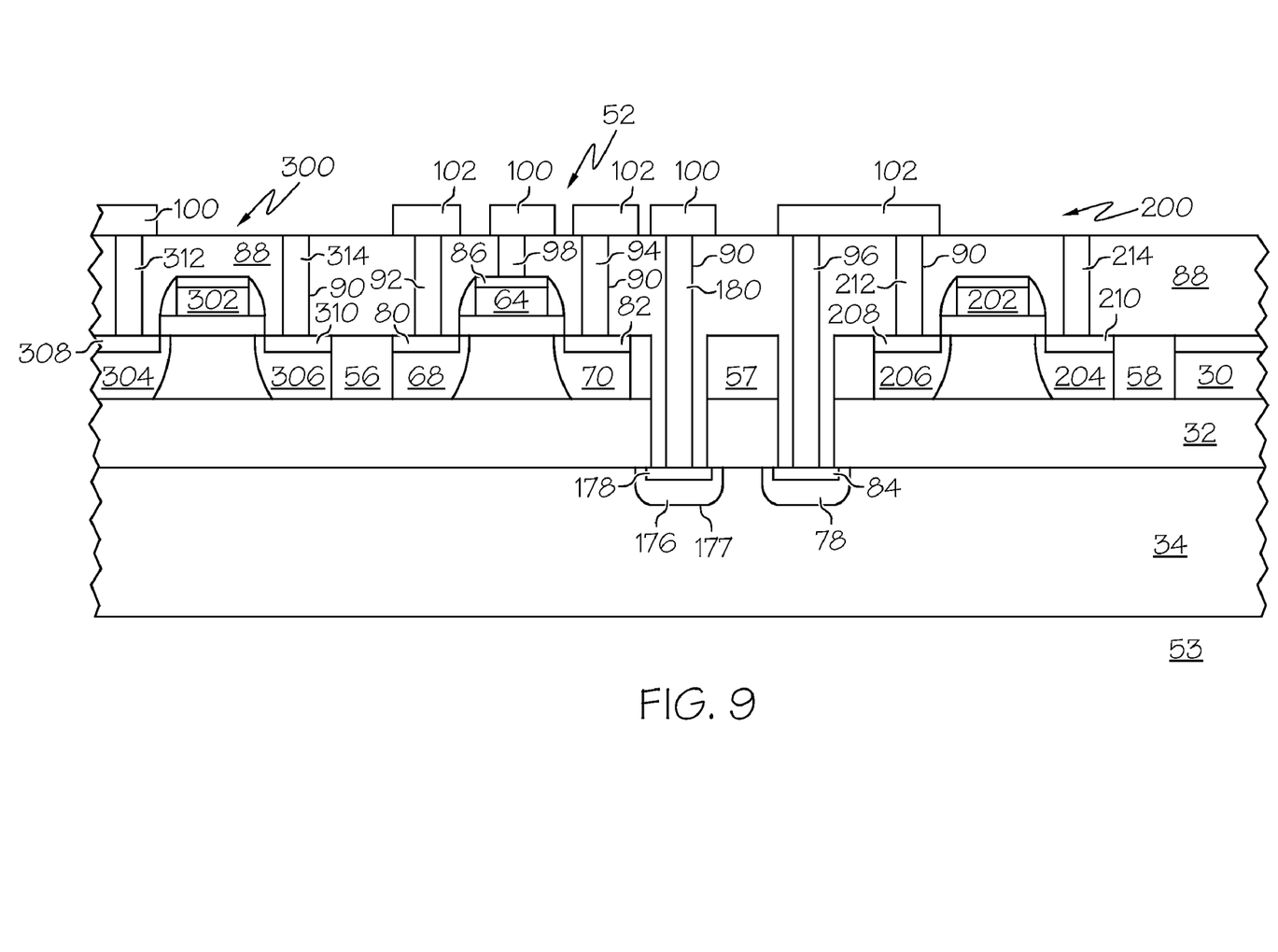

As illustrated in FIG. 8, a layer of metal 400 such as aluminum or an aluminum alloy is deposited over the top of dielectric layer 88 and in contact with the conductive plugs. The layer of metal is patterned, as illustrated in FIG. 9 to form portions of $V_{dd}$ bus 100 electrically coupled to drain 304 of N-channel MOS transistor 300, electrically coupled to top plate 64 of decoupling capacitor 52 and to diode 177. The layer of metal is also patterned to form portions of $V_{ss}$ bus 102 electrically coupled to bottom plate 60 of decoupling capacitor 52, to drain region 206 of P-channel MOS transistor 200 and to substrate contact 78.

Figure 10:
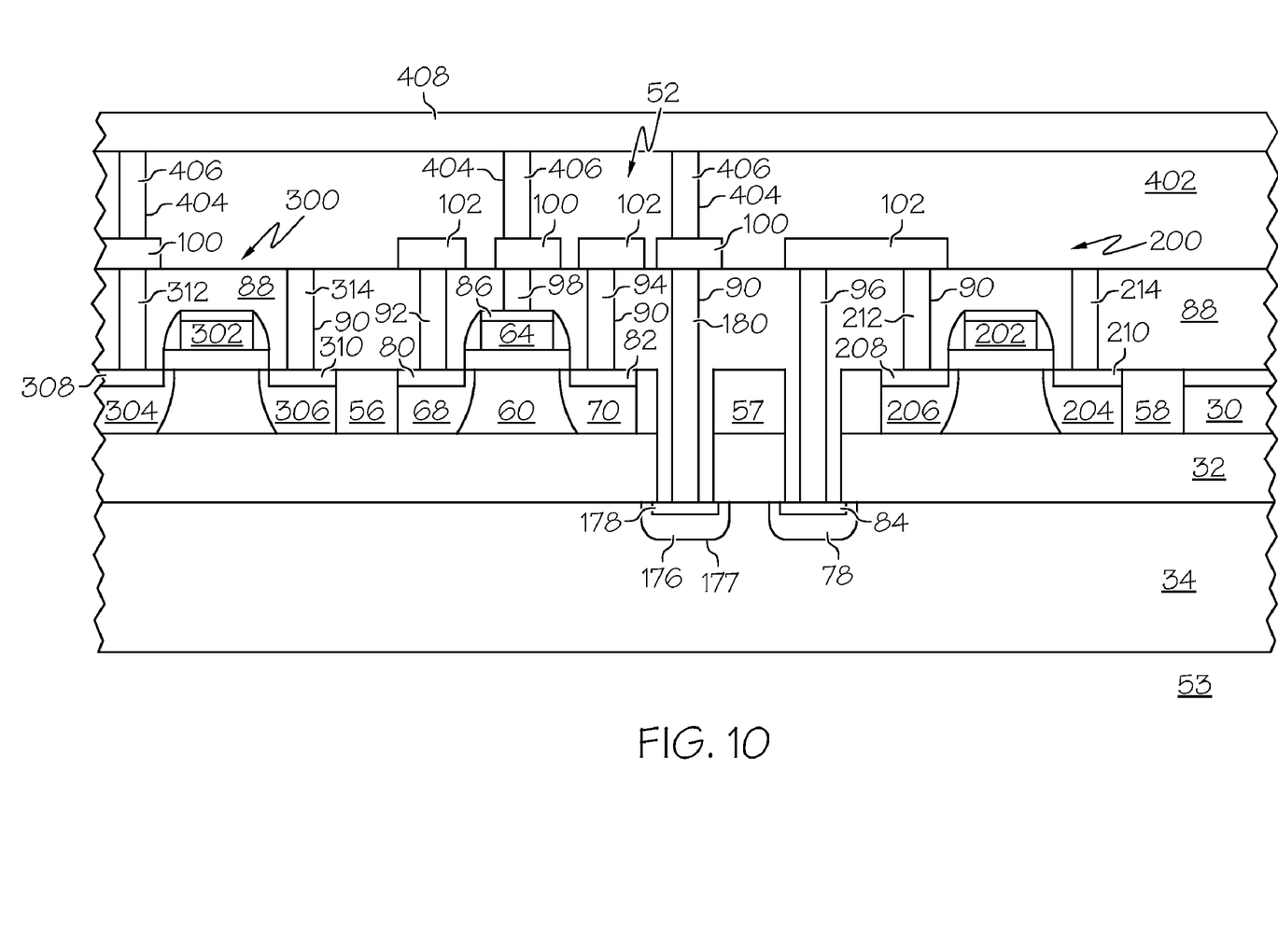

As illustrated in FIG. 10, the method continues, in accordance with one embodiment of the invention, by the deposition of another dielectric layer 402 overlying dielectric layer 88 and the patterned metal layer 400. Preferably the top surface of dielectric layer 402 is planarized, for example by a CMP process. Openings 404 are patterned and etched to extend through dielectric layer 402 to expose portions of $V_{dd}$ bus 100. Openings 404 can be filled with conductive plugs 406 and an additional layer of metal 408 is deposited onto the planarized upper surface of dielectric layer 402 and in electrical contact with conductive plugs 406.

Figure 11:
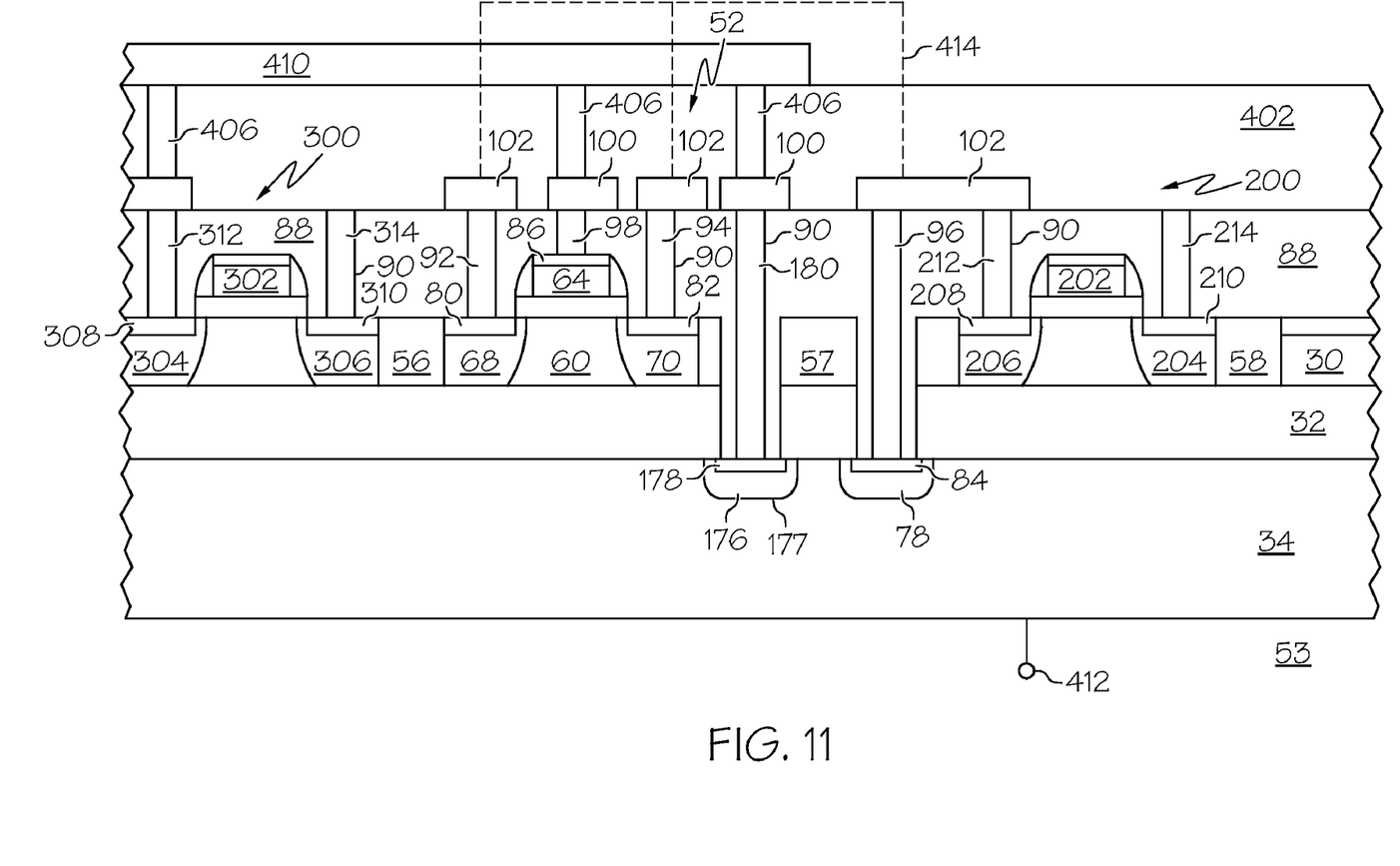

As illustrated in FIG. 11, metal layer 408 can be patterned and etched to form a portion 410 of the $V_{dd}$ bus that can be coupled, for example, to an external power supply. Although not illustrated in FIGS. 10 and 11 because of limitations of a two dimensional figure, additional openings can be patterned and etched through dielectric layer 402 to expose portions of $V_{ss}$ bus 102, those openings can be filled with conductive plugs, and a portion of metal layer 408 can be patterned to electrically connect to those conductive plugs. Additionally, a $V_{ss}$ connection can be made to substrate 34 as indicated at terminal 412.

The $V_{dd}$ bus is coupled to conductive plug 98 and hence to top plate 64 of decoupling capacitor 52. The $V_{ss}$ bus is coupled to conductive plugs 92 and 94 and hence to the bottom plate 60 of decoupling capacitor 52. The decoupling capacitor is thus coupled between the two voltage busses. In accordance with an embodiment of the invention, the $V_{dd}$ bus is also coupled to conductive plug 180 and hence to PN junction diode 177 formed in carrier substrate 34 providing an electrical discharge path for charge that may build up on the top plate of capacitor 52. Positive charge build up on top plate 64 can leak off to the substrate as reverse bias leakage current of PN junction diode 177. Negative charge build up on top plate 64 can leak off to the substrate as forward bias current of PN junction diode 177. In addition, in accordance with a further embodiment of the invention, the $V_{ss}$ bus is also coupled to conductive plug 96 and hence to carrier substrate 34, providing another electrical discharge path for charge that may build up on the bottom plate of the capacitor.

At least for some of the MOS transistors of integrated circuit 53, the $V_{dd}$ bus is also coupled to conductive plug 312 and hence to the drain of N-channel MOS transistor 300, and the $V_{ss}$ bus is also coupled to conductive plug 212 and hence to the drain of P-channel MOS transistor 200. Because of the limitations of a two dimensional figure, some of the direct connections between elements have been illustrated schematically by dotted lines 414. Although FIG. 11 illustrates a discharge path extending from $V_{dd}$ to pn junction diode 177, the discharge path can be coupled to extend from any non-ground circuit node that potentially can be harmed by a build up of charge generated through the various plasma etching and deposition steps employed in the fabrication of IC 53. The discharge path has been illustrated as extending from an impurity doped region of an MOS transistor to pn junction diode 177, but although not illustrated in the figures, the discharge path can also extend from a gate electrode such as gate electrode 302 of MOS transistor 300 to the pn junction diode.

While at least one exemplary embodiment has been presented in the foregoing detailed description, it should be appreciated that a vast number of variations exist. For example, the order of the method steps described above is illustrative only and is not intended to be limiting. Similarly, the enumerated metals, insulators, and ion species are illustrative only. Although the $V_{dd}$ bus and the $V_{ss}$ bus are illustrated in FIGS. 8-11 as being formed on the same metallization levels in the integrated circuit, they may also be formed at different metallization levels. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor on insulator (SOI) device comprising a semiconductor substrate, a buried insulator layer overlying the semiconductor substrate, and a monocrystalline semiconductor layer overlying the buried insulator layer, the method comprising the steps of:
   forming a MOS capacitor coupled between a first voltage bus and a second voltage bus, the MOS capacitor having a gate electrode material forming a first plate of the MOS capacitor and coupled to the first voltage bus, an impurity doped region in the monocrystalline semiconductor layer beneath the gate electrode material forming a second plate of the MOS capacitor and coupled to the second voltage bus, a first contact region electrically in series with the impurity doped region, and a second contact region electrically in series with the impurity doped region, wherein the gate electrode material, impurity doped region, first contact region, and second contact region each have the same conductivity type;
   forming a first electrical discharge path coupling the first plate of the MOS capacitor to a diode formed in the semiconductor substrate, wherein the first voltage bus is coupled to an n-type impurity doped region of the diode; and
   forming a second electrical discharge path coupling the second plate of the MOS capacitor to the semiconductor substrate, wherein the second electrical discharge path comprises conductors without any intermediate device included in the second electrical discharge path.

2. The method of claim 1 wherein the step of forming a first electrical discharge path comprises the steps of:
   forming a dielectric isolation region extending through the monocrystalline semiconductor layer to the buried insulator layer;
   etching an opening through the dielectric isolation region and the buried insulation layer to expose a portion of the semiconductor substrate;
   ion implanting first type conductivity determining impurities through the opening to form a PN junction diode in the semiconductor substrate; and
   coupling the first voltage bus to the PN junction diode in the semiconductor substrate.

3. The method of claim 2 further comprising the steps of:
   etching a second opening through a dielectric isolation region and the buried insulation layer to expose a second portion of the semiconductor substrate;
   ion implanting second type conductivity determining impurities through the opening to form a contact to the semiconductor substrate; and
   coupling the second voltage bus to the contact to the semiconductor substrate.

4. A method for fabricating a semiconductor on insulator (SOT) device comprising a p-type semiconductor substrate, a buried insulator layer overlying the p-type semiconductor substrate, and a monocrystalline semiconductor layer overlying the buried insulator layer, the method comprising the steps of:
   forming dielectric isolation regions extending through the monocrystalline semiconductor layer;
   doping a portion of the monocrystalline semiconductor layer with n-type impurity dopants to form an n-type impurity doped region that is a first plate of a capacitor;
   forming an insulator layer overlying the portion of the monocrystalline semiconductor layer;
   forming a conductive electrode overlying the insulator layer to form a second plate of the capacitor;
   etching an opening extending through one of the dielectric isolation regions and the buried insulator layer to expose a portion of the p-type semiconductor substrate;
   etching a second opening extending through one of the dielectric regions and the buried insulator layer to expose a second portion of the p-type semiconductor substrate;
   doping the second portion of the p-type semiconductor substrate with p-type impurities to form a contact to the p-type semiconductor substrate;
   doping a portion of the impurity doped region with n-type impurities to form first and second contact regions electrically in series with the impurity doped region, and simultaneously doping the portion of the p-type semiconductor substrate exposed through the opening with n-type impurities to form an n-type region forming a PN junction diode with the p-type semiconductor substrate;
   coupling a first bus to the second plate of the capacitor and to the n-type region of the PN junction diode; and
   coupling a second bus to the first plate of the capacitor and to the contact to the p-type semiconductor substrate.

5. The method of claim 4 wherein the step of forming a conductive electrode comprises the steps of:
   depositing a layer of polycrystalline silicon overlying the insulator layer; and
   patterning the layer of polycrystalline silicon to form a conductive electrode, a gate electrode of an NMOS transistor, and a gate electrode of a PMOS transistor.

6. The method of claim 5 wherein the step of doping the second portion of the p-type semiconductor substrate further comprises the step of forming source and drain regions of the PMOS transistor.

7. The method of claim 5 wherein the step of doping the portion of the p-type semiconductor substrate further comprises the step of forming source and drain regions of the NMOS transistor.

8. A method for fabricating a semiconductor component including a semiconductor on insulator (SOT) substrate having a first p-type semiconductor layer, a layer of insulator on the first p-type semiconductor layer, and a second semiconductor layer overlying the layer of insulator, the method comprising the steps of:
   forming an n-type region in the second semiconductor layer, wherein the n-type region is a bottom capacitor plate;
   forming a capacitor dielectric layer overlying the n-type region in the second semiconductor layer;
   forming a top capacitor plate overlying the capacitor dielectric layer;
   forming a contact area in the first p-type semiconductor layer;
   implanting n-type conductivity determining ions into the second semiconductor layer to form a drain region of an MOS transistor, into the top capacitor plate, and into the n-type region to form first and second n-type contact regions adjacent to and electrically in series with the n-type region;

implanting n-type conductivity determining ions into the first semiconductor layer to form an n-type impurity doped region forming a pn junction diode with the first p-type semiconductor layer; and depositing and patterning a metal layer to form a first voltage bus coupled to the drain region, to the top capacitor plate and to the n-type impurity doped region, and a second voltage bus coupled to the contact area in the first p-type semiconductor layer and to the n-type region in the second semiconductor layer.

9. The method of claim 8 further comprising the steps of:

depositing a first layer of insulating material overlying the second semiconductor layer;

etching the first layer of insulating material to form a first opening extending through the first layer of insulating material and exposing a portion of the drain region and a second opening exposing a portion of the n-type impurity doped region;

depositing a first layer of metal overlying the first layer of insulating material and electrically contacting the portion of the drain region and electrically contacting the portion of the impurity doped region; and patterning the first layer of metal to form a first interconnect electrically coupled to the portion of the drain region and a second interconnect electrically coupled to the portion of the impurity doped region.

10. The method of claim 9 further comprising the steps of:

depositing a second layer of insulating material overlying the first interconnect and the second interconnect;

etching a third opening extending through the second layer of insulating material and exposing a portion of the first interconnect; and etching a fourth opening extending through the second layer of insulating material and exposing a portion of the second interconnect.

11. The method of claim 10 wherein the step of depositing and patterning a metal layer comprises the steps of:

depositing a second layer of metal overlying the second layer of insulating material and electrically coupled to the first interconnect and to the second interconnect; and patterning the second layer of metal to form a voltage bus coupled to the first interconnect and to the second interconnect.

12. A method for fabricating a semiconductor on insulator (SOI) device comprising a semiconductor substrate, a buried insulator layer overlying the semiconductor substrate, and a monocrystalline semiconductor layer overlying the buried insulator layer, the method comprising the steps of:

forming a MOS decoupling capacitor coupled between a first voltage bus and a second voltage bus, the MOS decoupling capacitor having:
- an n-type impurity doped gate electrode material forming a first plate of the MOS decoupling capacitor and coupled to the first voltage bus;
- an n-type impurity doped region in the monocrystalline semiconductor layer beneath the n-type impurity doped gate electrode material forming a second plate of the MOS decoupling capacitor and coupled to the second bus; and
- first and second n-type contact regions adjacent the n-type impurity doped region; and forming an electrical discharge path coupling the first plate of the MOS decoupling capacitor to a diode formed in the semiconductor substrate.

13. The method of claim 12 wherein the step of forming an electrical discharge path comprises the steps of:

forming a dielectric isolation region extending through the monocrystalline semiconductor layer to the buried insulator layer;

etching an opening through the dielectric isolation region and the buried insulation layer to expose a portion of the semiconductor substrate;

ion implanting first type conductivity determining impurities through the opening to form a PN junction diode in the semiconductor substrate; and coupling the first voltage bus to the PN junction diode in the semiconductor substrate.

14. The method of claim 13 further comprising the steps of:

etching a second opening through a dielectric isolation region and the buried insulation layer to expose a second portion of the semiconductor substrate;

ion implanting second type conductivity determining impurities through the opening to form a contact to the semiconductor substrate; and coupling the second voltage bus to the contact to the semiconductor substrate.

15. The method of claim 12 further comprising the step of forming a second electrical discharge path coupling the second plate of the MOS decoupling capacitor to the semiconductor substrate, wherein the second electrical discharge path comprises conductors without any intermediate device included in the second electrical discharge path.

* * * * *

UNITED STATES PATENT AND TRADEMARK OFFICE
CERTIFICATE OF CORRECTION

PATENT NO. : 7,718,503 B2 Page 1 of 1
APPLICATION NO. : 11/459316
DATED : May 18, 2010
INVENTOR(S) : Mario Pelella et al.

It is certified that error appears in the above-identified patent and that said Letters Patent is hereby corrected as shown below:

Column 9, line 66, "(SOT)" should be changed to --(SOI)--;

Column 10, line 51 "(SOT)" should be changed to --(SOI)--;

Signed and Sealed this

Thirteenth Day of July, 2010

David J. Kappos
*Director of the United States Patent and Trademark Office*